United States Patent
Yeo et al.

(10) Patent No.: US 7,301,584 B2
(45) Date of Patent: Nov. 27, 2007

(54) DUAL MODE TUNING ARRANGEMENT

(75) Inventors: Alan Chin Leong Yeo, Singapore (SG); Kui Yong Lim, Singapore (SG)

(73) Assignee: NXP B.V., Eindhoven (NL)

( * ) Notice: Subject to any disclaimer, the term of this patent is extended or adjusted under 35 U.S.C. 154(b) by 499 days.

(21) Appl. No.: 10/523,382

(22) PCT Filed: Jul. 25, 2003

(86) PCT No.: PCT/IB03/03348

§ 371 (c)(1),
(2), (4) Date: Feb. 1, 2005

(87) PCT Pub. No.: WO2004/013954

PCT Pub. Date: Feb. 12, 2004

(65) Prior Publication Data

US 2005/0260959 A1    Nov. 24, 2005

(30) Foreign Application Priority Data

Aug. 1, 2002 (EP) .................................. 02017272

(51) Int. Cl.
*H04N 5/46* (2006.01)

(52) U.S. Cl. ........................................ 348/729; 348/725
(58) Field of Classification Search ................ 348/729, 348/725, 731–733; 331/16, 167; 455/180.1, 455/182.1, 182.2, 182.3, 188.1, 192.1, 192.2, 455/192.3, 168.1; *H04N 5/46, 5/44*
See application file for complete search history.

(56) References Cited

U.S. PATENT DOCUMENTS 5,404,052 A * 4/1995 Lange ......................... 327/109
6,353,462 B1 * 3/2002 Osada et al. ................. 348/729

FOREIGN PATENT DOCUMENTS

EP    911960 A1 * 4/1999
JP    61131919 A * 6/1986

* cited by examiner

*Primary Examiner*—Sherrie Hsia

(57) ABSTRACT

In a local oscillator for a tuning arrangement for both TV and FM signals there is substantial risk of parasitic oscillation. A special provision is disclosed for effectively reducing this risk. The special provision is a connection of a damping resistor ($R1a$) for suppressing parsitic oscillations between ground and a junction ($J2$) of a parallel LC resonator of the local oscillator.

1 Claim, 2 Drawing Sheets

DUAL MODE TUNING ARRANGEMENT

Figure 1:
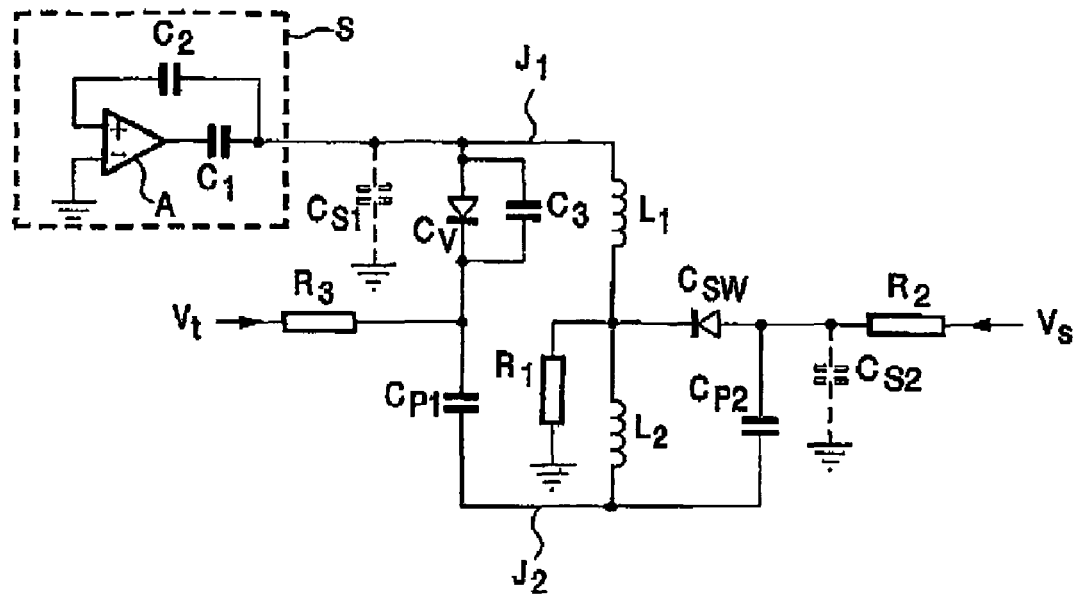

The invention relates to a dual mode tuning arrangement for tuning to VHF television signals and to FM radio signals, said arrangement having a local oscillator circuit comprising a first series arrangement of first and second inductances, a second series arrangement of a variable capacitance diode and a first padding capacitor, said first and second series arrangements being interconnected at first and second junctions to constitute a parallel arrangement, an active oscillator element being connected between the first junction of said parallel arrangement and ground, a third series arrangement of a mode switching diode and a second padding capacitor connected in parallel with one of said first and second inductances, means for supplying a tuning voltage to the junction of the variable capacitance diode and the first padding capacitor and means for supplying a mode switching voltage to the junction of the mode switching diode and the second padding capacitor. Such dual mode tuning arrangement is used in applicant's publicly available TV-FM tuner FM1200MK2.

In an arrangement of the above mentioned kind it is desirable to use the same local-oscillator circuit for both modes because the FM radio-band (88-110 MHz) lies between the VHF TV-bands. However, a different intermediate frequency is required for the reception of TV signals and the reception of FM signals. For reception of FM signals the intermediate frequency is 10,7 MHz whereas for the reception of TV signals the intermediate frequency is either 38,9 MHz (European PAL-standard) or 45,75 MHz (US NTSC-standard). Therefore the local oscillator circuit needs to be switched so that the local oscillator frequency is lower in the FM mode than in the TV mode. This is the function of the mode switch.

The nature of simple mode tuned circuits is that they have very high impedance at resonance while on either side of the resonance frequency the impedance quickly decays to very low levels. Hence in those circuits only a single oscillation is sustained. However, in dual mode tuned circuits of the above mentioned kind, unwanted or parasitic oscillations may easily occur and these parasitic oscillations have to be sufficiently damped. This is particularly critical in applications where a phase locked loop (PLL) synthesizer measures the actual frequency and uses the result to line up the tuned circuit. If the PLL would acquire an undesired oscillation it can be driven into "lock up".

In the above mentioned publicly known tuning arrangement a provision is made to damp parasitic oscillations by grounding the junction point between the two inductances through a relatively low-value damping resistor. However it appeared that this solution is not sufficiently satisfactory. The active oscillation element (the PLL) is usually realized in integrated form and it appears that with modern PLL synthesizer IC's with improved high frequency performance the known dual mode tuned circuit still has substantial problems with parasitic oscillations. Increasing the value of the damping resistor may increase the damping of parasitic oscillation, however this solution would result in more noise with lower performance of the oscillator. Another problem is that there is a practical upper limit to the value of the damping resistor by the fact that this resistor also functions as a DC path to ground for the mode switching diode.

It is the object of the present invention to provide an improved dual mode tuning arrangement with reduced risk of parasitic oscillations and the arrangement according to the invention is therefore characterized by a damping resistor for suppressing parasitic oscillations connected between the second junction of said parallel arrangement and ground.

Apart from the reduced risk of parasitic oscillations the arrangement of the present invention has the additional advantage that the desired oscillations are substantially not influenced by the damping resistor and the advantage that the modification can be accomplished without any change of layout of the printed circuit board which usually carries the components of the arrangement.

Figure 3:
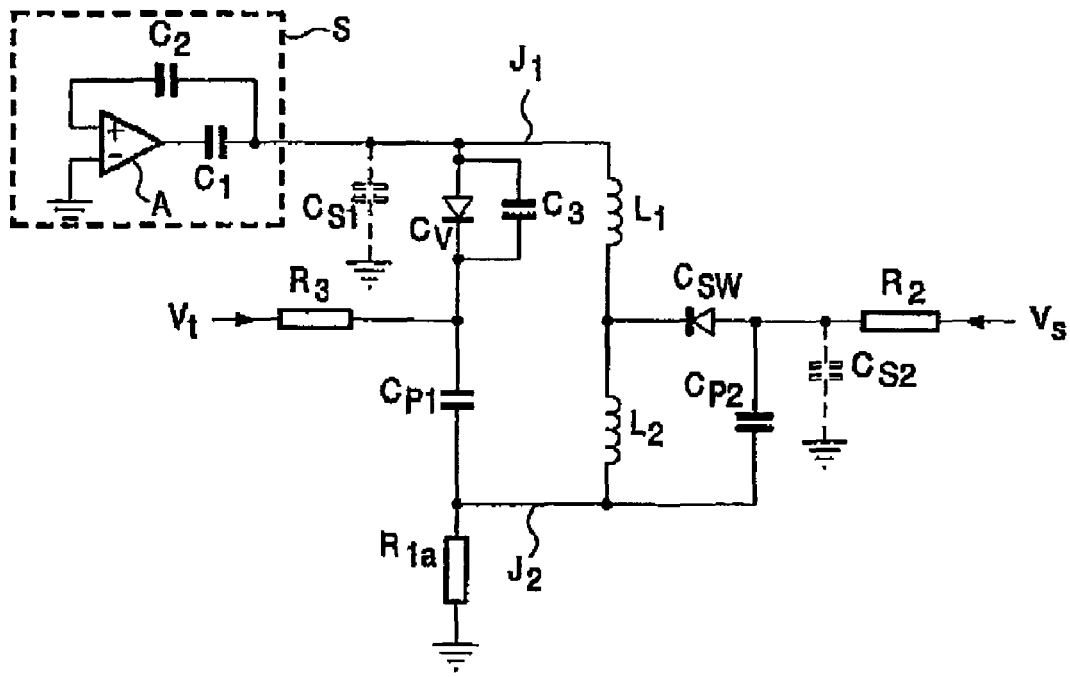
Figure 2:
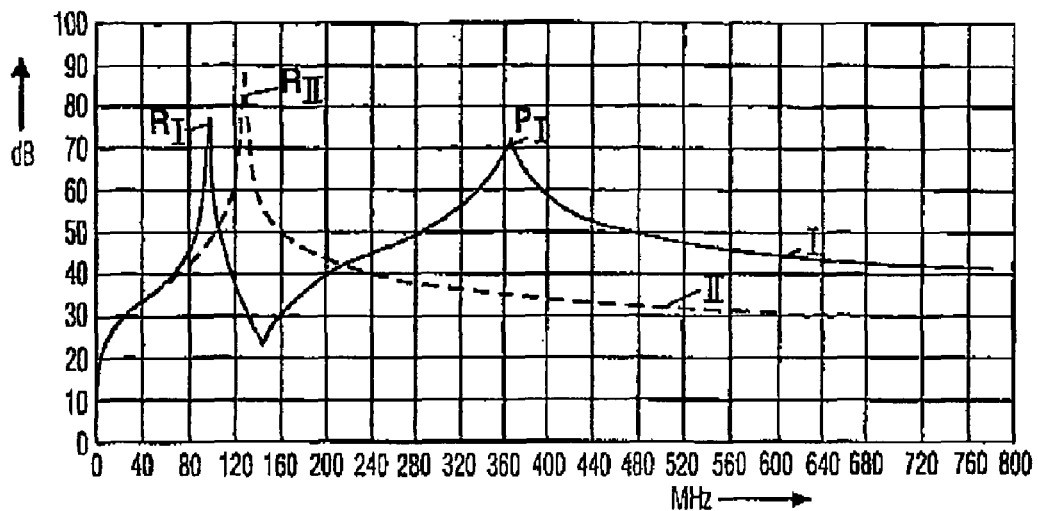
Figure 4:
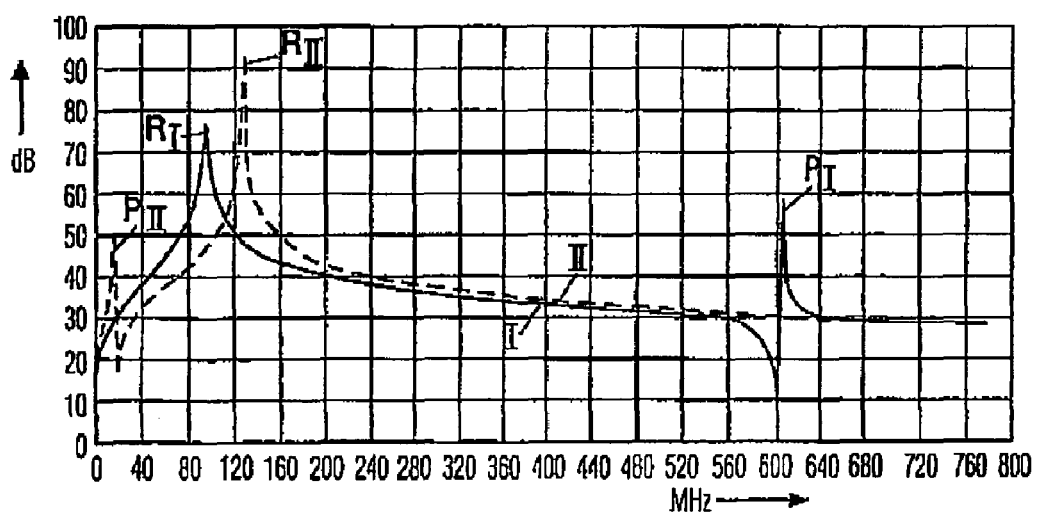

The invention will now be described with reference to the accompanying drawings. Herein shows:

FIG. 1 a schematic diagram of the prior art dual mode tuning arrangement,

FIG. 2 graphs representing the impedance versus frequency characteristic of the arrangement of FIG. 1 in both modes, FIG. 3 a schematic diagram of a dual mode tuning arrangement according to the invention and FIG. 4 graphs representing the impedance versus frequency characteristic of the arrangement of FIG. 3 in both modes.

The tuning arrangement of FIG. 1 comprises a first series-arrangement of two inductors $L_1$ and $L_2$ and a second series-arrangement of a variable capacitance diode $C_v$ and a padding capacitor $C_{p1}$. The two series arrangements are interconnected at junctions $J_1$ and $J_2$ to constitute a parallel arrangement. A small capacitor $C_3$ is connected in parallel with the variable capacitance diode $C_v$. The junction $J_1$ of the two series-arrangements is connected to an amplifier A through a coupling capacitor $C_1$ and a positive feedback capacitor $C_2$. The amplifier A and the two capacitors $C_1$ and $C_2$ constitute the active part of the arrangement or current source S that supplies an AC current to the junction $J_1$. A tuning voltage $V_t$ is applied through a resistor $R_3$ to the junction of the variable capacitance diode $C_v$ and the padding capacitor $C_{p1}$. The tuning voltage may be e.g. be derived from a frequency synthesizer that is located, together with the amplifier A, in a monolithic integrated circuit.

A third series arrangement of a mode switching diode $C_{sw}$ and a second padding capacitor $C_{p2}$ is connected in parallel with the inductor $L_2$ and a mode-switching voltage $V_s$ is applied to the junction of the mode switching diode and the second padding capacitor through a resistor $R_2$. The junction of the inductors $L_1$ and $L_2$ is grounded through a relatively small damping resistor $R_1$.

In operation, during FM reception, no switching voltage is applied through the resistor $R_2$ and the switching diode $C_{sw}$ behaves like a small capacitor of e.g. 1 pF. In this FM-mode the elements $L_1$, $L_2$, $C_{p1}$ and $C_v+C_3$ constitute a resonant circuit whose resonant frequency substantially determines the desired oscillator frequency. Varying the tuning voltage $V_t$ varies this frequency within the range required for tuning within the FM radio band. The values of the padding capacitor $C_{p1}$ and the capacitor $C_3$ assure that the oscillator frequency substantially tracks with the tuned input circuits (not shown) at a distance of 10,7 MHz.

During reception of TV signals a positive voltage $V_s$ is applied through resistor $R_2$ to the mode switching diode $C_{sw}$. In this mode the diode $C_{sw}$ behaves like a capacitance of e.g. 1 nF. This capacitance and the padding capacitor $C_{p2}$ bypass the inductor $L_2$, so that the resonant circuit is now formed by the elements $L_1$, $C_v+C_3$, $C_{p1}$, $C_{p2}$ and $C_{sw}$.

The resistor $R_1$ serves to damp any parasitic oscillation of the arrangement. To analyse the parasitic oscillation behaviour of the arrangement it is convenient to consider the active current source S as a negative impedance and to calculate the (positive) impedance of the tank circuit (i.e. all elements of the arrangement except the source S) as seen by the current source S. Oscillation will take place at any frequency where the tank circuit impedance is greater than the negative impedance of the current source. For the determination of the tank-circuit impedance a stray capacitance $C_{s1}$ of the junction J1 to ground and a second stray capacitance $C_{s2}$ of the junction of $C_{sw}$ and $C_{p2}$ to ground have been taken into account.

The impedance of the tank-circuit is shown in FIG. 2 with the frequency (in MHz) along the horizontal axis and the amplitude of the impedance (in dB) along the vertical axis. For the calculation the following realistic values were chosen:

$L_1$=170 nH, $L_2$=120 nH, $R_1$=5,6 Ω, $R_2$=10 kΩ, $R_3$=10 kΩ, $C_3$=0,5 pF, $C_{p1}$=120 nF, $C_{p2}$=220 nF, $C_{s1}$=0,8 pF and $C_{s2}$=0,8 pF.

$C_v$=7,5 pF which is somewhere in the middle of the tuning range.

$C_{sw}$=1 pF in FM-mode and 1 nF in TV-mode.

In FIG. 2 the curve I represents the impedance of the tank-circuit in FM mode and the curve II represents this impedance in TV mode.

In TV mode the desired oscillation frequency occurs at the resonance peal $R_{II}$ (approximately 130 MHz). In this mode there is no parasitic resonance within the range of measurement between 0 and 800 MHz. In FM mode the desired oscillation frequency occurs at the resonance peak $R_I$ (approximately 100 MHz). In this mode however, also a parasitic resonance peak $P_I$ exists at approximately 375 MHz. This parasitic resonance is mainly attributed to current travelling in the loop $C_{s1}$, $L_1$, $R_1$. From the graph of FIG. 2 it can be seen that the impedance at this parasitic oscillation is only about 10 dB lower than that of the desired oscillation. This is too less to be sure that no parasitic oscillation at this frequency would occur.

An improved arrangement is shown in FIG. 3. The only difference with respect to the arrangement of FIG. 1 is that the damping resistor $R_1$ is now replaced by a damping resistor $R_{1a}$, which is connected between the junction $J_2$ and ground. FIG. 4 shows the impedance-graph of the so modified arrangement with the same values as given above and with the same value for the resistor $R_{1a}$ as for the resistor $R_1$ of FIG. 1. The graph shows that the parasitic peak $P_I$ in FM mode is significantly reduced and also shifted away from the desired oscillation frequency (to approximately 500 MHz) so that the risk of parasitic oscillation is substantially minimized. It may also be seen that a parasitic peak $P_{II}$ is now present in the TV mode, however this peak has sufficiently reduced level and a sufficiently low frequency that no risk of parasitic oscillation on this peak exists.

It has to be noted that in the arrangement of FIG. 3 modifications may be made without departing from the scope of the invention. E.g. the inductor $L_1$ and the inductor $L_2$ with parallel connected $C_{sw}$-$C_{p2}$ combination may be interchanged. Also in the two series arrangements $C_v$-$C_{p1}$ and $C_{sw}$-$C_{p2}$ the components may be interchanged with proper choice of the polarity of the respective diode.

The invention claimed is:

1. A dual mode tuning arrangement for tuning to VHF television signals and to FM radio signals, said arrangement having a local oscillator circuit comprising a first series arrangement of first and second inductances ($L_1$, $L_2$), a second series arrangement of a variable capacitance diode ($C_v$) and a first padding capacitor ($C_{p1}$), said first and second series arrangements being interconnected at first and second junctions ($J_1$, $J_2$) to constitute a parallel arrangement, an active oscillator element (S) being connected between the first junction ($J_1$) of said parallel arrangement and ground, a third series arrangement of a mode switching diode ($C_{sw}$) and a second padding capacitor ($C_{p2}$) connected in parallel with one of said first and second inductances, means ($R_3$) for supplying a tuning voltage ($V_t$) to the junction of the variable capacitance diode ($C_v$) and the first padding capacitor ($C_{p1}$) and means ($R_2$) for supplying a mode switching voltage ($V_s$) to the junction of the mode switching diode ($C_{sw}$) and the second padding capacitor ($C_{p2}$), characterized by a damping resistor ($R_{1a}$) for suppressing parasitic oscillations connected between the second junction ($J_2$) of said parallel arrangement and ground.

* * * * *